(12) United States Patent
Buckley et al.

(10) Patent No.: US 10,651,845 B2
(45) Date of Patent: May 12, 2020

(54) INVERTER BRANCH DRIVER

(71) Applicant: Commissariat A L'Energie Atomique et aux Energies Alternatives, Paris (FR)

(72) Inventors: Julien Buckley, Grenoble (FR); Rene Escoffier, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/531,288

(22) Filed: Aug. 5, 2019

(65) Prior Publication Data
US 2020/0044647 A1   Feb. 6, 2020

(30) Foreign Application Priority Data

Aug. 6, 2018  (FR) .................................... 18 57326

(51) Int. Cl.
| | |
|---|---|
| H03K 17/687 | (2006.01) |
| H03K 3/037 | (2006.01) |
| H02M 1/08 | (2006.01) |
| H02M 7/537 | (2006.01) |
| H03K 19/20 | (2006.01) |

(52) U.S. Cl.
CPC .......... H03K 17/6871 (2013.01); H02M 1/08 (2013.01); H02M 7/537 (2013.01); H03K 3/037 (2013.01); H03K 19/20 (2013.01); H03K 2217/0063 (2013.01); H03K 2217/0072 (2013.01)

(58) Field of Classification Search
CPC combination set(s) only.
See application file for complete search history.

(56) References Cited

U.S. PATENT DOCUMENTS

| | | | |
|---|---|---|---|
| 8,004,330 B1 * | 8/2011 | Acimovic | ........ H03K 19/00361 |
| | | | 327/108 |
| 9,831,867 B1 | 11/2017 | Kinzer et al. | |
| 2005/0184310 A1 | 8/2005 | Krutko et al. | |
| 2006/0113566 A1 | 6/2006 | Krutko et al. | |
| 2014/0167069 A1 | 6/2014 | Vielemeyer et al. | |

(Continued)

OTHER PUBLICATIONS

French Preliminary Search Report dated Jul. 1, 2019 in French Application 18 57326, filed on Aug. 6, 2018 (with English translation of categories of cited documents & Written Opinion).

(Continued)

Primary Examiner — Adam D Houston
(74) Attorney, Agent, or Firm — Oblon, McClelland, Maier & Neustadt, L.L.P.

(57) ABSTRACT

An electronic circuit is provided, including, on one same substrate, an inverter branch formed by high side and low side transistors, and the drivers of the high side and the low side transistors. The drivers include logic gates configured to receive one same PWM input signal and to generate two alternated command signals sent to the high side and the low side transistors. An inverter system is also provided, including the electronic circuit and laser optocouplers configured to electrically insulate the electronic circuit of a controller delivering a pulse width modulation (PWM) input signal and a main supply electrically supplying the drivers.

18 Claims, 6 Drawing Sheets

(56) References Cited

U.S. PATENT DOCUMENTS

| | | | |
|---|---|---|---|
| 2015/0311797 A1* | 10/2015 | Okamatsu | H02M 3/1582 |
| | | | 323/271 |
| 2016/0043072 A1* | 2/2016 | Vielemeyer | H01L 27/0629 |
| | | | 327/109 |
| 2016/0087623 A1* | 3/2016 | Yamaguchi | H03K 17/163 |
| | | | 327/109 |
| 2016/0126949 A1* | 5/2016 | Lim | H03K 17/785 |
| | | | 327/109 |
| 2018/0026623 A1 | 1/2018 | Cairoli et al. | |
| 2018/0026628 A1* | 1/2018 | Lu | H03K 17/04123 |
| | | | 327/108 |
| 2018/0131282 A1 | 5/2018 | Chen et al. | |
| 2018/0294732 A1* | 10/2018 | Ye | H02M 3/33546 |

OTHER PUBLICATIONS

Tang, G., et al., "High-Speed, High-Reliability GaN Power Device with Integrated Gate Driver", IEEE Proceedings of the 30$^{th}$ International symposium on Power Semiconductor Devices & ICs, 2018, pp. 76-79.

* cited by examiner

INVERTER BRANCH DRIVER

TECHNICAL FIELD OF THE INVENTION

The invention relates to command and control circuits for power converters. It has at least one particularly advantageous application in the field of inverters.

STATE OF THE ART

An inverter is a power converter, in particular used for converting a direct current (DC) into an alternating current (AC).

Such an inverter generally comprises one or more inverter branches and one or more systems for driving the inverter branch.

The inverter branch is formed by a high side switch, and a low side switch, alternatively functioning in half-bridge configuration so as to generate the AC current from the DC current.

To convert a high power, it is advantageous to use power transistors to form high side and low side switches, for example GaN-based high electron mobility transistors (HEMT).

The alternating controlling of these transistors is carried out by the command system.

This command system generally comprises control electronics and drivers dedicated to each of the high side and low side transistors. The drivers are commonly called "drivers" or "gate drivers". They receive control signals coming from the control electronics and deliver command signals to the transistors. The control electronics and the drivers are supplied by an electrical supply.

The command system is generally external to the inverter branch, for reasons of technological, volume and electromagnetic insulation compatibility, vis-à-vis the strict functioning environment.

The control electronics of the inverter branch is often based on a CMOS (complementary metal oxide semiconductor) technology. In the case of an inverter branch, in particular based on a HEMT technology, such control electronics cannot be directly integrated to the inverter branch, due to the absence of transistors complementary to the HEMT having good performances (mobility of holes).

This CMOS control electronics furthermore requires a DC supply which can be voluminous.

For reasons of functioning safety, the inverter branch must be electrically insulated vis-à-vis control signals and the electrical supply of the command system. This insulation is generally achieved at the level of the drivers, by a galvanic insulation, for example.

This galvanic insulation is also voluminous and difficult to integrate.

For these reasons, the command system is generally assembled in a casing, different from that of the inverter branch.

A disadvantage of this solution is that the maximum functioning frequency of the inverter is limited.

Another disadvantage of this solution is a limited immunity of the inverter facing a magnetic field, typically for a magnetic field of 10 Gauss to 1 MHz.

Document U.S. Pat. No. 9,831,867 B1 discloses a solution where the command system and the inverter branch are integrated on one same chip. The electronic circuit in a half-bridge of the proposed inverter is based on a GaN technology. This electronic circuit comprises, in particular, an inverter branch and a command system functioning with GaN-based transistors.

The command system of the inverter branch uses signals for controlling pulse width modulation (PWM). An HS_PWM signal is sent into the input of the high side driver driving the high side GaN transistor and an LS_PWM signal is sent into the input of the low side driver driving the low side GaN transistor.

The alternated functioning of the high side and low side transistors is ensured by a blanking pulse generator, making it possible to introduce dead times and to guarantee the non-recovery of command signals coming from HS_PWM and LS_PWM control signals.

A disadvantage of this solution is that the maximum functioning frequency of the inverter is intrinsically limited.

An aim of the present invention is to overcome at least partially some of the disadvantages mentioned above.

According to a particular aspect, an aim of the present invention is to propose a simple and inexpensive inverter electronic circuit integrating the command system and the inverter branch on one same chip.

Another aim of the present invention is to propose an inverter electronic circuit aiming to optimise the maximum functioning frequency of the inverter.

Other aims, features and advantages of the present invention will appear upon examining the following description and supporting drawings. It is understood that other advantages can be incorporated.

SUMMARY OF THE INVENTION

To achieve this aims, a first aspect of the invention relates to an electronic circuit comprising an inverter branch and a system for driving this inverter branch formed at least partially on one same semi-conductive substrate.

The inverter branch comprises a first power transistor of high electron mobility transistor (HEMT) type connected to a floating potential and a high side transistor of the inverter branch, and a second power transistor of HEMT type connected to a ground and forming a low side transistor of the inverter branch.

The system for driving the inverter branch comprises a first circuit for driving the high side transistor configured to deliver a first command signal to a high side transistor gate from a first input signal received at an input of said first circuit, and a second circuit for driving the low side transistor configured to deliver a second command signal to a gate of the low side transistor from a second input signal received at an input of said second circuit.

Advantageously, but in a non-limiting manner, the first and second input signals are synchronous and preferably phased and the first and second drivers respectively comprise a first and a second plurality of logic gates configured to deliver the first and second command signals without time overlap from the first and second input signals.

According to the invention and particularly advantageously, the use of synchronous input signals makes it possible to have an identical time reference for the first and second drivers. The use of phased input signals furthermore makes it possible to temporally offset these signals directly at the level of the first and second drivers. The first and second pluralities of logic gates subsequently make it possible to generate the first and second command signals having a very specific relative time difference. This offset is not due to external or prior control electronics, and can thus be precisely controlled by the first and second drivers. The use of one single and same input signal, duplicated so as to produce the first and second input signals, is also made possible by the invention. Thus, the invention makes it possible to significantly improve the precision over the time difference obtained and therefore to considerably increase the functioning frequency of the electronic circuit, for example, the switching frequency of an inverter.

Furthermore, the generation of this time difference at the level of drivers directly formed on the same semi-conductive substrate as the inverter branch makes it possible to subtract this time difference at the parasitic sources external to said substrate. This solution removes, for example, the parasitic inductances encountered in the driver configurations external to the inverter branch, and which generate an uncontrolled delay in the time difference.

The first and second pluralities of logic gates formed on the same substrate as the inverter branch thus make it possible to generate the first and second command signals having a relatively minimised time difference.

Such a time difference makes it possible to ensure the non-recovery of the first and second command signals, while minimising the dead times between these command signals.

The functioning frequency of the inverter is thus found to be optimised.

Advantageously, the integration of the drivers on the same substrate as the transistors of the inverter branch makes it possible to reduce the propagation delays between the input and command signals.

Such an integration also makes it possible to extend the electrical insulation, for example galvanic, of the inverter branch. The appearance of parasitic high-frequency oscillations due to the inductance of the galvanic insulation is subsequently limited, even removed.

Reducing propagation delays and limiting parasitic oscillations improve the functioning of the high-frequency inverter.

Such an integration furthermore makes it possible to considerably reduce the volume of the inverter.

According to a preferred but non-limiting embodiment, the first and second pluralities of logic gates only comprise transistors called gate transistors and resistances, and the gate transistors are formed on the same semi-conductive substrate as the high side and low side transistors.

This architecture is simple and makes it possible to minimise the production costs.

This architecture furthermore makes it possible to advantageously avoid an RC characteristic time such as that of the blanking pulse generator disclosed in document U.S. Pat. No. 9,831,867 B1.

The dead times linked to this RC characteristic time are subsequently advantageously minimised and the functioning frequency of the inverter is also found to be improved. Thus, the invention offers significantly improved performances, in particular with respect to the solution disclosed in document U.S. Pat. No. 9,831,867 B1.

A second aspect of the invention relates to an inverter system comprising an electronic circuit according to the first aspect of the invention, a first supply configured to supply the first driver, a second supply configured to supply the second driver, and at least one controller configured to deliver the first and second input signals.

The inverter system further preferably comprises a power generator at the output of the first high side transistor, said generator being commanded by the electronic circuit and configured to deliver a high power.

This inverter system makes it possible to convert a high power direct current DC into a high power alternating current AC, simply and inexpensively, and by benefiting from an optimised functioning frequency.

According to a preferred but non-limiting embodiment, the electronic circuit of the inverter system is electrically insulated of the first and second supplies and of the at least one controller, by at least one optical coupler called optocoupler.

This optocoupler advantageously comprises at least one matrix of laser diodes coupled with at least one matrix of photovoltaic cells facing one another.

The matrix of laser diodes is configured to receive an electrical signal coming from, for example, at least one from among the first and second supplies, or from the at least one controller, and to generate, from said electrical signal, a luminous flux sent to at least one matrix of photovoltaic cells.

The matrix of photovoltaic cells is configured to receive this luminous flux and to subsequently deliver at least one from among the first and second supplies, or at least one from among the first and second input signals, according to where the electrical signal comes from.

Such an optocoupler advantageously makes it possible to remove the parasitic inductance linked to a galvanic insulation.

Using laser diodes furthermore makes it possible to deliver a luminous flux having a power sufficient to transmit the electrical supply signals to the at least one matrix of photovoltaic cells. Specifically, such an optocoupler can therefore electrically supply the drivers of the inverter branch.

Such an optocoupler also have a limited volume and can therefore be easily integrated in the same casing as the electronic circuit.

The invention proposed can be advantageously used for any application requiring an inverter. As non-limiting examples, the electric vehicle can be equipped with at least one of the aspects of the invention; the cutting supplies (regulation of the output voltage, AC/AC, AC/DC, DC/DC, DC/AC converters) can resort to at least one of the aspects of the invention; the transmission of insulated digital data or the controlling of power supply loads from an accessible low-voltage circuit are also other applications which could benefit from at least one of the aspects of the invention.

BRIEF DESCRIPTION OF THE FIGURES

The aims, objectives, as well as the features and advantages of the invention will best emerge from the detailed description of embodiments of the latter which are illustrated by the following supporting drawings, wherein.

The drawings are given as examples and are not limiting of the invention. They constitute schematic principle representations intended to facilitate the understanding of the invention and are not necessarily to the scale of practical applications.

In particular, the thicknesses and dimensions of the different layers and portions of the devices illustrated are not representative of the reality.

Certain choices of schematic representations can combine standardised symbols, for example American or European, with other symbols freely executed and explained in reference to the description.

DETAILED DESCRIPTION OF THE INVENTION

Before starting a detailed review of embodiments of the invention, it is reminded that the invention according to the first aspect thereof comprises, in particular, the optional features below, which could be used in association or alternatively:

According to an embodiment, the gate transistors of the first and second pluralities of logic gates are only N-type channel field effect transistors.

According to an embodiment, the first plurality of logic gates comprises at least:
 a first delay function logic gate configured to delay the first input signal, and
 a first AND-type logic gate comprising two inputs receiving respectively the first input signal and the first delayed input signal,
and the second plurality of logic gates comprises at least:
 a second delay function logic gate configured to delay the second input signal, and
 a NO-type logic gate configured to invert the second delayed input signal, and another NO-type logic gate configured to invert the second input signal.
 a second AND-type logic gate comprising two inputs receiving respectively the second inverted input signal and the second delayed and inverted input signal.

This architecture makes it possible to precisely delay the first and second command signals relative to one another. This architecture also makes it possible to alternate the values that take the first and second command signals respectively between a first high value and a first low value, and between a second high value and a second low value.

This architecture therefore makes it possible to generate high side and low side command signals having both a time alternance and a value alternance.

According to an embodiment, the one-stage NO-type logic gates each comprise one single gate transistor having a gate width (generally called Wg in literature) of between 0.5 mm and 2 mm.

According to an embodiment, the one-stage NO-type logic gates are identical to one another.

According to an embodiment, the first plurality of logic gates further comprises:
 a first NO-type logic gate configured to invert a signal coming from the first AND-type logic gate, and to deliver the first command signal to the gate of the first high side transistor without a fall in potential of this first command signal for a current intensity of this first command signal of between 500 mA and 5 A.

and the second plurality of logic gates further comprises:
 a second NO-type logic gate configured to invert a signal coming from the second AND-type logic gate, and to deliver the second command signal to the gate of the second low side transistor, without a fall in potential of this second command signal for a current intensity of this second command signal of between 500 mA and 5 Å.

The first and second logic gates thus ensure the inverter logic functions thereof for a wide current range. This makes it possible to obtain, in particular, a command as viable for high currents and powers.

According to an embodiment, the first and second NO-type logic gates are called two-stage logic gates and each comprise a first stage formed by a one-stage NO-type logic gate and a second stage connected to the first stage and comprising two gate transistors operating in phase opposition and each having a gate width of between 5 mm and 50 mm and preferably between 5 mm and 20 mm.

Such transistors functioning in phase opposition make it possible to delay the inverter logic function of the one-stage NO-type logic gates, while offering an increase access resistance at the level of the gates thereof. These high access resistances make it possible to maintain the potentials of the first and second command signals with nominal values.

According to an embodiment, the gate transistors of the second stage have access resistances at the level of the gates thereof greater than 1 MegaOhm, and preferably greater than 1 GigaOhm.

According to an embodiment, the first and second input signals are pulse width modification (PWM) signals.

According to an embodiment, the semi-conductive substrate, the first and second high side and low side transistors, and the gate transistors of the first and second plurality of logic gates are GaN-based.

The invention according to the second aspect thereof, in particular comprises the optional features below, which could be used in association or alternatively:

According to an embodiment, the inverter system further comprises a power generator at the output of the first high side transistor, said generator being configured to deliver an electrical signal Vout which could have a high power.

According to an embodiment, the semi-conductive substrate, a source of the second low side transistor and the power generator are connected to a common ground.

The connection of the generator and of the source of the second low side transistor to this common ground makes it possible to ensure a reference for the electrical signal Vout.

The connection of the semi-conductive substrate to this same ground prevents said substrate from being floating. This makes it possible to limit the parasitic signals and the load trappings at the level of each of the transistors of the first and second pluralities of logic gates and the first and second high side and low side transistors. This makes it possible, also to avoid a self-polarised substrate effect which can be damaged at the gate polarisation of transistors.

According to an embodiment, the electronic circuit is electrically insulated from the at least one controller, by at least one optical coupler called optocoupler comprising a matrix of laser diodes and at least one facing matrix of photovoltaic cells, said matrix of laser diodes being configured to receive an electrical signal coming from the at least one controller, and to generate, according to said electrical signal, a luminous flux sent to the at least one matrix of photovoltaic cells, said at least one matrix of photovoltaic cells being configured to receive the luminous flux and to deliver at least one from among the first and second input signals.

According to an embodiment, the electronic circuit is electrically insulated from at least one from among the first and second supplies, by at least one optical coupler called optocoupler comprising a matrix of laser diodes and at least one facing matrix of photovoltaic cells, said matrix of laser diodes being configured to receive an electrical signal coming from at least one from among the first and second supplies, and to generate, according to said electrical signal, a luminous flux sent to the at least one matrix of photovoltaic cells, said at least one matrix of photovoltaic cells being configured to receive the luminous flux and to deliver at least one from among the first and second supplies.

According to an embodiment, the electronic circuit and the at least one optocoupler are assembled in one same packaging.

According to an embodiment, the first and second supplies are one same supply called main supply.

According to an embodiment, the at least one controller is one single controller called main controller.

According to an embodiment, the main supply is electrically insulated from the electronic circuit by a first optocoupler comprising a matrix of laser diodes connected to said main supply, a first matrix of photovoltaic cells connected to the first driver and a second matrix of photovoltaic cells connected to the second driver, said first and second matrices of photovoltaic cells being coupled with and facing said matrix of laser diodes of the first optocoupler, said first and second matrices of photovoltaic cells being configured to supply respectively the first and second drivers.

According to an embodiment, the main controller is electrically insulated from the electronic circuit by a second optocoupler comprising a matrix of laser diodes connected to said main controller, a first matrix of photovoltaic cells connected to the first driver and a second matrix of photovoltaic cells connected to the second driver, said first and second matrices of photovoltaic cells being coupled with and facing said matrix of laser diodes of the second optocoupler, said first and second matrices of photovoltaic cells being configured to deliver respectively the first and second input signals to the first and second drivers.

In the present invention, by "HEMT-type transistors", this means high electron mobility transistors, sometimes also designated by the term of heterostructure field effect transistors. Such a transistor includes the superposition of two semi-conductive layers having different band gaps, which form a quantum well at the interface thereof. Electrons are confined in this quantum well to form a two-dimensional electron gas. For reasons of maintaining at a high voltage and at a temperature, these transistors are selected so as to have a wide energy band gap.

Among the HEMT transistors with a wide energy band gap, gallium nitride-based transistors are highly promising. The energy band gap width (>3 eV) induces a greater critical electric field compared with conventional electronics materials, a high saturation speed of carriers and good thermal and chemical stabilities. The breakdown field of gallium nitride can thus be greater than $2 \times 10^6$ V/cm, which makes it possible to easily produce compact transistors with breakdown voltages greater than 600V. With a lateral conduction transistor, the gate/drain breakdown voltage can easily be controlled by a suitable distance between gate and drain. A breakdown voltage of around 600V can thus be reached for a distance between the gate and the drain of the transistor of around a few microns (4 to 10 µm, for example). In addition, such transistors make it possible for very high current densities, due to the very high electronic mobility and to the high electronic density in the interface electron gas.

It is specified that, in the scope of the present invention, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

It is specified that, in the scope of the present invention, the relative arrangement of a third layer inserted between a first layer and a second layer, does not compulsorily mean that the layers are directly in contact with one another, but means that the third layer is directly in contact with the first and second layers, or separated from these by at least one other layer or at least one other element. For example, and in a manner known per se, in the field of GaN-based HEMT-type transistors, a thin AlN layer can be inserted between two GaN and AlGaN semi-conductive layers.

By a material A-"based" substrate, device, layer, this means a substrate, a device, a layer comprising this material A only, or this material A and possibly other materials, for example alloy element, impurities or doping elements, the material A having advantageous properties for the substrate, the device, or the layer. Thus, a gallium-nitride (GaN)-based transistor comprises a GaN-active portion, with possibly doped portions or made of AlGaN alloy, for example.

In the present invention, by "NMOS-type transistors", this means field effect transistors, wherein the main carriers are electrons; they have, in particular, an N-type channel capable of making an electron current pass through.

Different transistor architectures can be used, for example, but in a non-limiting manner. MOSFET ("Metal Oxide Semiconductor Field Effect Transistor") where the metal gate is insulated from the channel, MESFET ("Metal Semiconductor FET") where the metal gate is directly in contact with the channel, HFET ("Heterostructure FET") where a large gap semiconductor is inserted between the gate and the channel, MODFET ("Modulation Doped FET") where the dopants are mainly situated in the large gap semiconductor, while the electrons coming from these dopants mainly pass through into the channel.

Generally, if the gate of the NMOS transistor is put at a voltage greater than a threshold voltage, the source and the drain are connected by the channel and the transistor is called looped. If the gate of the NMOS transistor is put at a voltage less than the threshold voltage, the source and the drain are no longer connected and the transistor is called blocked.

Subsequently, maintaining a nominal value, for example a voltage value greater than the threshold value, means that this value has no significant variations over time, during which it is maintained. For example, for transistors configured to receive, at the input of a signal of which the voltage is between 0V and 5V, maintaining the nominal voltage value in the looped state means that this value remains strictly greater than 2V. Maintaining the nominal voltage value in the blocking state means that this value remains strictly less than 0.2V.

The electrons circulate between the source and the drain along the length of the channel.

The width dimension of the channel can be sized according to the intensity of the electron current that is desired to make it pass through the transistor.

Subsequently, by "development" of a transistor, this means the width dimension of the gate. For example, a 10 mm development transistor has a gate 10 mm wide, the channel could have, for example, a length of between 250 nm and 2 µm.

In the figures, the following notations are used: G for gate, S for source, D for drain.

The power converters have the function of converting an electrical signal (a first source) into another electrical signal (a second source). There are, for example, converters intended to convert an alternating current into another alternating current (AC/AC converters), converters intended to convert a direct current into another direct current (DC/DC converters), converters intended to convert an alternating current into a direct current (AC/DC converters called rectifiers), and converters intended to convert a direct current into an alternating current (DC/AC converters called inverters).

An inverter is therefore connected, on the one hand, to a direct voltage source and, on the other hand, to one or more resistive or inductive loads. These connections are made at the level of an inverter branch. An inverter can be constituted of one or more branches.

The inverter branch can be constituted by one or more switching cells.

Each switching cell is formed of a pair of high side and low side switches connected together. By the clearance of the switching of these switches, the inverter periodically modifies the interconnection of the voltage source and of the load.

The switching cell must respect the fundamental interconnection rules of the following sources:

A voltage source must not be short-circuited, but it can be open.

A current source must not be open, but it can be short-circuited.

Therefore, it must be that the state of the two switches of the switching cell is complementary, i.e. that when the high side switch is blocked, the low side switch is looped and vice versa.

To ensure this complementary switching, the high side and low side switches are commanded by command signals, temporally separated.

One or more of the drivers can be, in particular, designed so as to generate command signals without time recovery.

A driver is an assembly of physical components connected or linked together, such that it can be commanded, be directed or be adjusted itself, or to command, direct or adjust another system such as an inverter system.

These drivers can, for example, introduce dead times between the command signals of each switch of the switching cell.

Figure 1A:
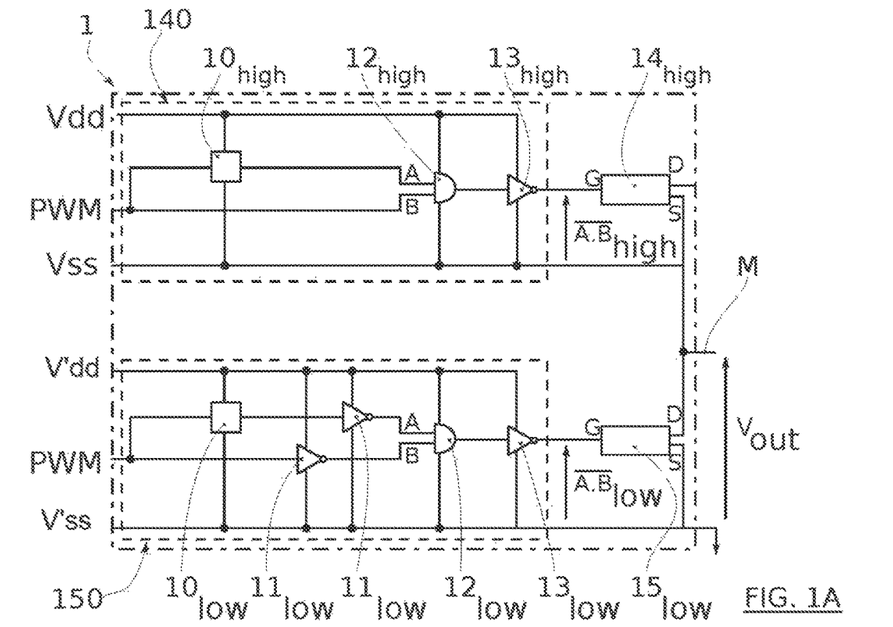
FIG. 1A shows a diagram of an electronic circuit according to an embodiment of the present invention.

According to the invention, a first embodiment of the electronic circuit comprising the drivers of an inverter branch will now be described in reference to FIG. 1A.

The electronic circuit 1 comprises an inverter branch formed by a pair of high side and low side switches, and drivers of these switches.

The high side switch is formed by a first high side transistor 14 of which the source is with a floating potential.

This high side transistor 14 is preferably an HEMT transistor, for example GaN or AsGa-based. This high side transistor 14 can have a 300 mm development, so as to function with a current of around 30 Å. In particular, this high side transistor 14 is configured to support a high voltage load having a voltage, for example, greater than 400V, and preferably greater than 600V, for example, for a gate/drain distance greater than or equal to 10 µm.

The low side switch is formed by a second low side transistor 15 of which the source is at the ground.

This low side transistor 15 can also have a 300 mm development, so as to also support a load current of around 30 A and a high voltage having a voltage, for example, greater than 400V, and preferably greater than 600V.

The high side 14 and low side 15 transistors can have a threshold voltage of between 1.5V and 4V, which is adjustable according to needs.

The high side 14 and low side 15 transistors are connected together so as to form a half-bridge circuit.

In particular, the source of the high side transistor 14 is connected to the drain of the low side transistor 15, and the drain of the low side transistor 15 has an output connection at the level of a middle point M.

The inverter branch thus has an output at middle point M making it possible to supply an alternating current load.

The high side transistor 14 is commanded by a first driver 140 comprises a first plurality of logic gates 10, 12, 13.

The low side transistor 15 is commanded by a second driver 150 comprising a second plurality of logic gates 10, 11, 12, 13.

Figure 2A:
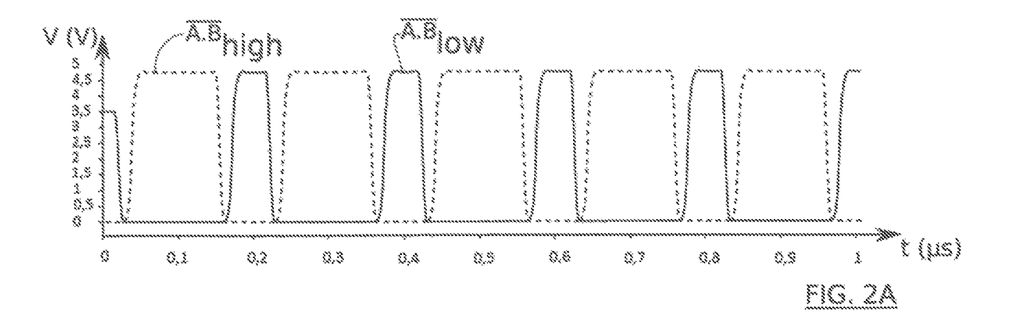
FIG. 2A shows the first and second command signals obtained by simulation from an electronic circuit according to an embodiment of the present invention.

The first driver 140 can be configured to deliver to the gate of the high side transistor 14, a first command signal $\overline{A \cdot B}_{high}$ such as illustrated in FIG. 2A.

This first command signal has a voltage which could vary between a low value less than the threshold voltage of the high side transistor 14, for example substantially equal to 0V, and a high value greater than the threshold value of the high side transistor 14, for example, of between 4.5V and 5V. This voltage of the first command signal is equal to the potential difference between the gate potential of the high side transistor 14 and the floating potential.

The second driver 150 can be configured to deliver to the gate of the low side transistor 15, a second command signal $\overline{A \cdot B}_{low}$ such as illustrated in FIG. 2A.

This second command signal can vary between a low value less than the threshold value of the low side transistor 15, for example, substantially equal to 0V, and a high value greater than the threshold value of the low side transistor 15, for example between 4.5V and 5V.

This voltage of the second command signal is equal to the potential difference between the gate potential of the low side transistor 15 and the ground of the circuit 1.

The first and second command signals are temporally alternated such that the high value of the first command signal temporally corresponds to the low value of the second command signal, and such that the high value of the second command signal temporally corresponds to the low value of the first command signal.

In particular, the first and second drivers 140, 150 are configured such that the first and second command signals never have the respective high values thereof simultaneously. The high side 14 and low side 15 transistors are subsequently never in the looped state simultaneously.

The first and second command signals can have the respective low values thereof simultaneously. The high side 14 and low side 15 transistors can subsequently be in the blocking state simultaneously.

Figure 2B:
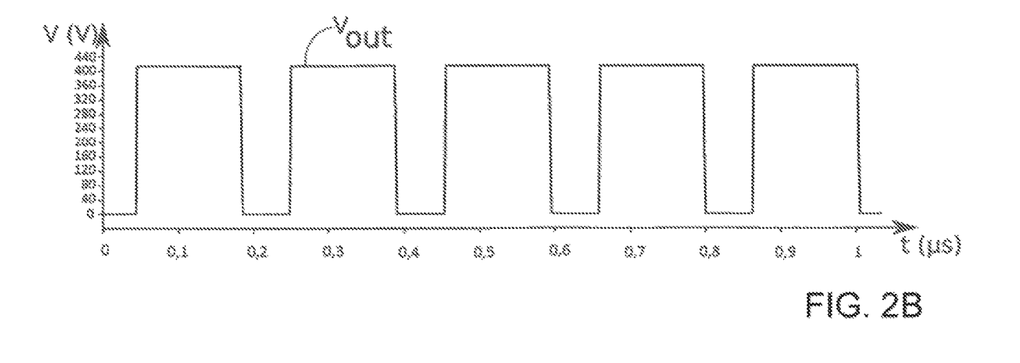
FIG. 2B shows an electrical signal obtained by simulation from an inverter system according to an embodiment of the present invention.

The inverter branch can be configured to deliver, at the level of the output at middle point M, an output signal such as illustrated in FIG. 2B.

This output signal can have an alternative voltage varying between 0V and a peak voltage greater than or equal to 400V, for example, or greater than or equal to 600V.

The output signal can have a slot or substantially sinusoidal form.

To obtain a sinusoidal form of the output signal, the command signals of the high side 14 and low side 15 transistors are preferably pulse width modulated by the respective drivers.

These drivers 140, 150 can in particular receive, at the input, pulse width modulation input signals, noted PWM, from one or more controllers.

The drivers can in particular receive synchronous PWM input signals. According to an advantageous possibility, the first and second drivers each receive a temporally identical PWM input signal.

This PWM input signal is subsequently processed by the first and second pluralities of logic gates, so as to obtain the first and second command signals described above.

Advantageously, the first and second pluralities of logic gates comprise NMOS transistors only functioning with electrons. This functioning is compatible with the functioning of an HEMT transistor.

The first and second drivers 140, 150 can subsequently be integrated on one same chip and on one same semi-conductive substrate as the high side 14 and low side 15 transistors.

In particular, the channel of the NMOS transistors and the channel of the HEMT high side 14 and low side 15 transistors can be formed in one same semi-conductive layer of the semi-conductive substrate.

The semi-conductive substrate preferably comprises a GaN-based semi-conductive layer.

The formation of NMOS transistors and the formation of HEMT high side 14 and low side 15 transistors can advantageously share most common technological steps.

This construction compatibility makes it possible to simplify the production of the electronic circuit 1.

This furthermore makes it possible to reduce the production costs of the electronic circuit 1.

Moreover, such an electronic circuit 1 associating these first and second drivers 140, 150 to the HEMT high side 14 and low side 15 transistors and only functioning with electrons has an optimised functioning. In particular, the switching speed of the high side 14 and low side 15 transistors can be optimised.

The first plurality of logic gates preferably comprises a first delay function logic gate $10_{high}$, a first AND-type logic gate $12_{high}$ and a first NO-type logic gate $13_{high}$.

The first delay function gate 10 high preferably receives, at the input, the PWM input signal and delivers, at the output, a first delayed PWM signal.

The first AND-type gate $12_{high}$ preferably receives, on an input A, the PWM input signal and, on an input B, the first delayed PWM signal coming from the first delay function gate $10_{high}$, and delivers, at the output, a signal $A \cdot B_{high}$.

The first NO-type gate $13_{high}$ preferably receives, at the input, the signal $A \cdot B_{high}$ coming from the first AND-type gate $12_{high}$, and delivers, at the output, a signal $\overline{A \cdot B}_{high}$ corresponding to the first command signal.

The second plurality of logic gates preferably comprises a second delay function logic gate $10_{low}$, two NO-type logic gates $11_{low}$, a second AND-type logic gate $12_{low}$ and a second NO-type logic gate $13_{low}$.

The second delay function gate $10_{low}$ preferably receives, at the input, the PWM input signal and delivers, at the output, a second delayed PWM signal.

One from among the two NO-type gates $11_{low}$ preferably receives, at the input, the PWM input signal and delivers, at the output, an inverted PWM input signal. The other from among the two NO-type gates $11_{low}$ preferably receives, at the input, the second delayed PWM signal and delivers, at the output, an inverted, delayed PWM signal.

The second AND-type gate $12_{low}$ preferably receives, on an input A, the inverted PWM input signal coming from one from among the two NO-type gates $11_{low}$ and, on an input B, the inverted, delayed PWM signal coming from the other from among the two NO-type gates $11_{low}$, and delivers, at the output, a signal $A \cdot B_{low}$.

The second NO-type gate $13_{low}$ preferably receives, at the input, the signal $A \cdot B_{low}$ coming from the second AND-type gate $12_{low}$, and delivers, at the output, a signal $\overline{A \cdot B}_{low}$ corresponding to the second command signal.

According to this embodiment, the PWM input signal is distributed over two branches corresponding to the inputs A and B of the second AND-type gate $12_{low}$, processed then inverted on each of the front branches to be delivered to said inputs A and B.

Figure 1B:
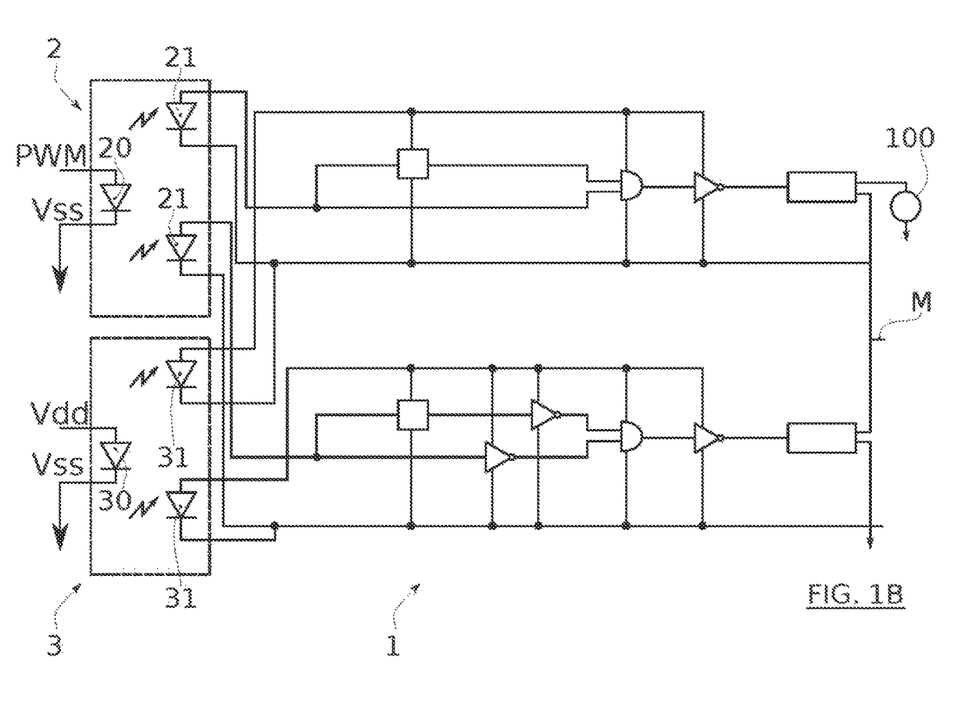
FIG. 1B shows a diagram of an inverter system according to an embodiment of the present invention.
Figure 1C:
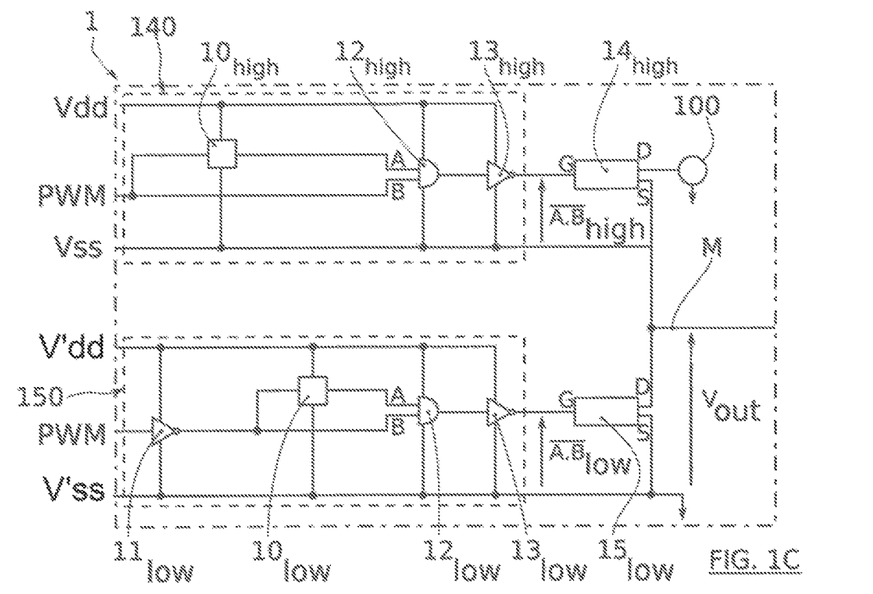
FIG. 1C shows a diagram of an electronic circuit according to another embodiment of the present invention.

According to an alternative embodiment illustrated in FIG. 1C, the second plurality of logic gates comprises a second delay function logic gate $10_{low}$, one single NO-type logic gate $11_{low}$, a second AND-type logic gate $12_{low}$ and a second NO-type logic gate $13_{low}$.

The NO-type gate $11_{low}$ preferably receives, at the input, the PWM input signal and delivers, at the output, an inverted PWM input signal.

The second delay function gate $10_{low}$ preferably receives, at the input, the inverted PWM input signal and delivers, at the output, a delayed, inverted PWM signal.

The second AND-type gate $12_{low}$ preferably receives, on an input A, the inverted PWM input signal coming from the NO-type gate $11_{low}$ and, on an input B, the delayed, inverted PWM signal coming from the second delay function gate $10_{low}$, and delivers, at the output, a signal $A \cdot B_{low}$.

The second NO-type gate $13_{low}$ preferably receives, at the input, the signal $A \cdot B_{low}$ coming from the second AND-type gate $12_{low}$, and delivers, at the output, a signal $\overline{A \cdot B}_{low}$ corresponding to the second command signal.

According to this embodiment, the PWM input signal is first inverted, then distributed and processed on two branches corresponding to the inputs A and B of the second AND-type gate $12_{low}$. This operation only requires one single NO-type logic gate $11_{low}$. According to this possibility, the complexity and the cost associated with the production of the second plurality of logic gates are reduced with respect to the embodiment described above.

The two NO-type logic gates $11_{low}$ preferably comprise one single NMOS transistor associated with a resistance R1.

The NMOS transistor is preferably a 1 mm development GaN-based transistor.

The resistance R1 can have a value of between 500 Ohms and 2000 Ohms, for example.

Figure 3A:
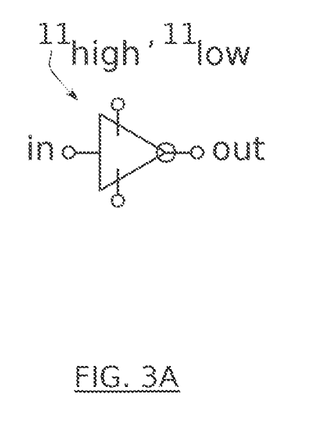
FIGS. 3A and 3B illustrate respectively a logic symbol and a diagram of physical embodiment of a one-stage logic gate of NO type according to an embodiment of the present invention.
Figure 3B:
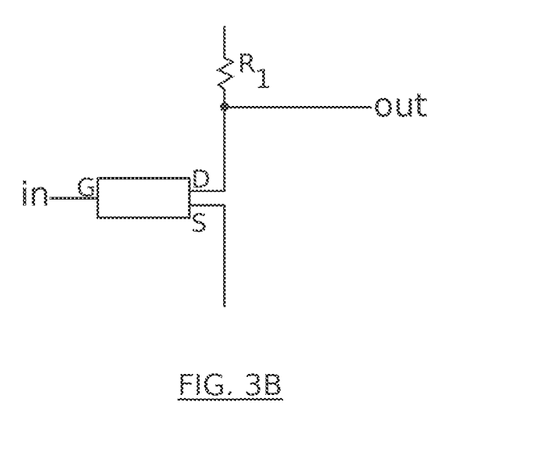

A logic symbol and an architecture of these NO-type logic gates $11_{low}$ are illustrated in FIGS. 3A and 3B respectively.

These two NO-type logic gates $11_{low}$ are identical and the description below of one of these logic gates is valid for the other logic gate.

The input of such a logic gate is connected to the gate of the NMOS transistor. The drain of the NMOS transistor is connected to the resistance.

The output of the logic gate is situated between the drain and the resistance. This logic gate can be electrically supplied by a supply source at the potentials V'dd and V'ss.

In particular, the source of the transistor is preferably connected to V'ss, and the resistance is preferably connected to V'dd by a side opposite the side connected to the drain.

Such an architecture is subsequently called "one-stage NO-type logic gate 11". This architecture preferably constitutes a basic brick of the electronic circuit 1.

The first and second NO-type logic gates $13_{high}$, $13_{low}$ preferably each comprise a first stage formed by a one-stage NO-type logic gate 11 and a second stage comprising two NMOS transistors U1, U2.

These first and second NO-type logic gates $13_{high}$, $13_{low}$ are configured to load the respective gates of the high side 14 and low side 15 transistors.

The two NMOS transistors U1, U2 are preferably 10 mm development GaN-based transistors.

Such a development makes it possible, in particular, to make a current pass into these transistors of an intensity greater than that passing into the NMOS transistor of the first stage.

These NMOS transistors U1, U2 can have, vis-á-vis high side 14 and low side 15 transistors, a development ratio greater than 20 and preferably greater than or equal to 30.

This sizing can make it possible for the NMOS transistors U1, U2 and for the high side 14 and low side 15 transistors to function in an optimised manner, each in the functioning range thereof.

Figure 4A:
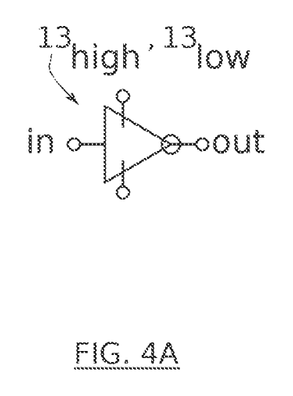
FIGS. 4A and 4B illustrate respectively a logic symbol and a diagram of physical embodiment of a two-stage logic gate of NO type according to an embodiment of the present invention.
Figure 4B:
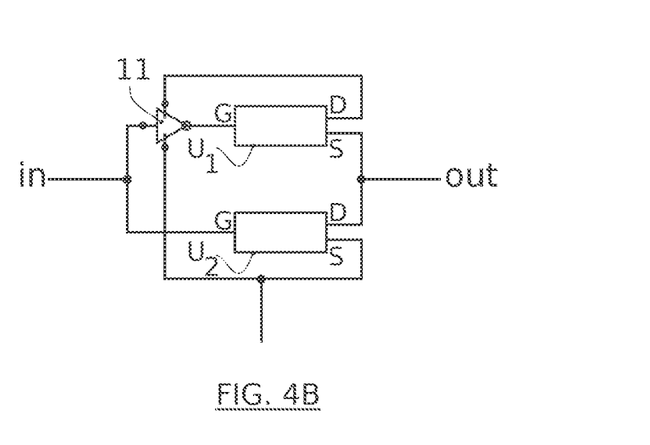

A logic symbol and an architecture of these first and second NO-type logic gates $13_{high}$, $13_{low}$ are illustrated in FIGS. 4A and 4B respectively.

The description below of one of these logic gates is valid for the other logic gate.

The input of such a logic gate is connected, on the one hand, to the input of the one-stage NO-type logic gate 11 of the first stage, and on the other hand, to the gate of the transistor U2.

The gate of the transistor U1 is connected to the output of the one-stage NO-type logic gate 11 of the first stage.

The drain of the transistor U2 is directly connected to the source of the transistor U1.

The output of this logic gate is situated between the drain and the source directly connected from these two transistors U2, U1.

Advantageously, the access resistance to the gate of the transistor U1 is greater than the resistance R1 of the first stage. This makes it possible to make a current pass into the transistors U1, U2 of an intensity greater than that passing into the NMOS transistor of the first stage, without a significant fall in potential at the level of the output of this logic gate. This logic gate therefore advantageously makes it possible to maintain a nominal voltage value at the output, for example greater than the threshold value of the high side transistor 14 or of the low side transistor 15, even for high intensity currents. In particular, the transistors U1, U2 can deliver and maintain a voltage of 5V under a current of IA.

This logic gate can be electrically supplied by a supply source at the potentials Vdd and Vss (or V'dd and V'ss).

In particular, the source of the transistor U2 is preferably connected to Vss (or V'ss) and the drain of the transistor U1 is preferably connected to Vdd (or V'dd). The supply source also supplies the one-stage NO-type logic gate of the first stage.

Such an architecture is subsequently called, "two-stage NO-type logic gate".

The two NO-type logic gates $13_{high}$, $13_{low}$ can be identical, or sized according to the high side 14 and low side 15 transistors.

For example, for high side 14 and low side 15 transistors having a development ratio substantially equal to 30, the transistors U1, U2 of the first NO-type logic gate $13_{high}$ can have a development greater than a factor substantially equal to 30 to the development of the transistors U1, U2 of the second NO-type logic gate $13_{low}$.

The first and second AND-type logic gates $12_{high}$, $12_{low}$ preferably comprise each of the two NMOS transistors and a resistance.

The two NMOS transistors T1, T2 are preferably 1 mm development GaN-based transistors.

Figure 5A:
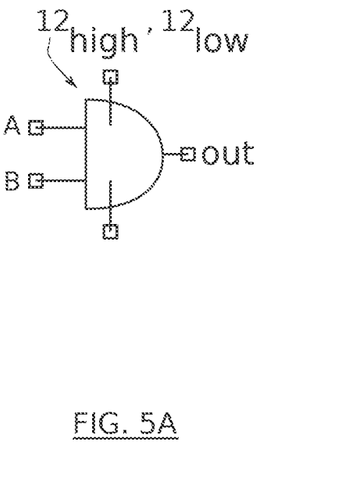
FIGS. 5A and 5B illustrate respectively a logic symbol and a diagram of physical embodiment of a logic gate of AND type according to an embodiment of the present invention.
Figure 5B:
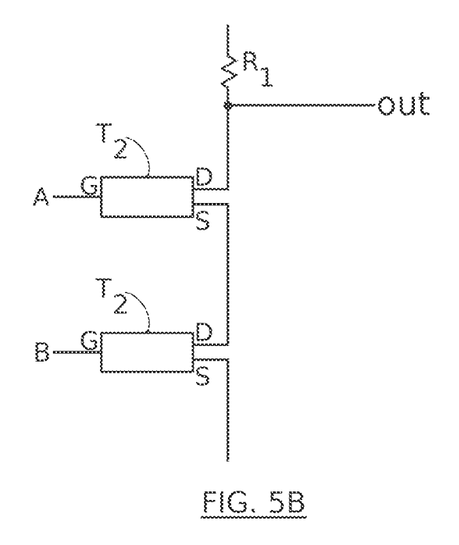

A logic symbol and an architecture of these first and second AND-type logic gates $12_{high}$, $12_{low}$ are illustrated in FIGS. 5A and 5B respectively.

These two AND-type logic gates $12_{high}$, $12_{low}$ can be identical and the description below of one of these logic gates is valid for the other logic gate. Such a logic gate has two inputs A and B.

The input A of such a logic gate is preferably connected to the gate of the transistor T1.

The input B of such a logic gate is preferably connected to the gate of the transistor T2.

The drain of the transistor T2 is directly connected to the source of the transistor T1.

The drain of the transistor T1 is connected to the resistance R1.

The output of the logic gate is situated between the drain of the transistor T1 and the resistance R1.

This logic gate can be electrically supplied by a supply source at the potentials Vdd and Vss (or V'dd and V'ss).

In particular, the source of the transistor T2 is preferably connected to Vss (or V'ss), and the resistance R1 is preferably connected to Vdd (or V'dd) by a side opposite the side connected to the drain of the transistor T1.

The first and second delay function logic gates $10_{high}$, $10_{low}$ preferably each comprise a plurality of one-stage NO-type logic gates 11.

Figure 6A:
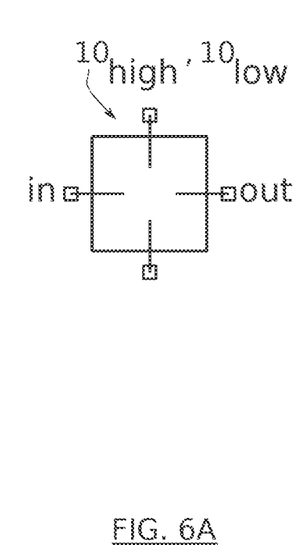
FIGS. 6A and 6B illustrate respectively a logic symbol and a diagram of physical embodiment of a delay function logic gate according to an embodiment of the present invention.
Figure 6B:
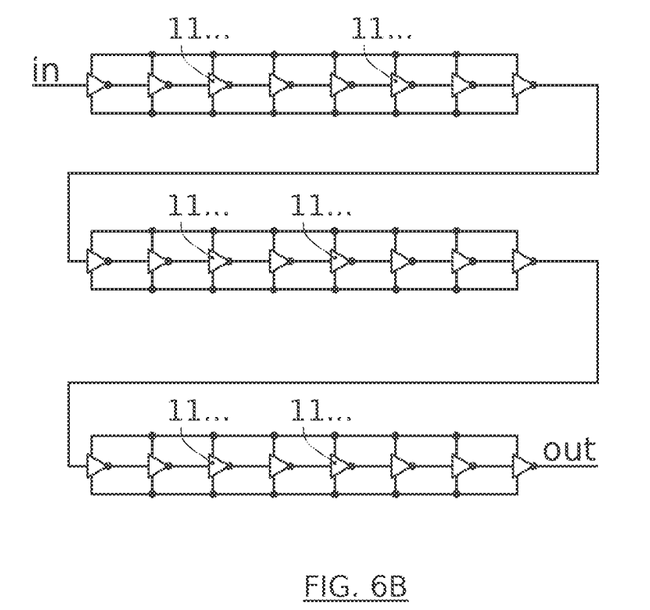

A logic diagram and an architecture of these first and second delay function logic gates $10_{high}$, $10_{low}$ are illustrated in FIGS. 6A and 6B respectively.

The description below of one of these logic gates is valid for the other logic gate.

The input of such a logic gate receives a PWM signal. It corresponds to the input of a one-stage NO-type logic gate 11.

The output of such a logic gate delivers a delayed PWM signal. It corresponds to the output of another one-stage NO-type logic gate 11.

Such a delay function logic gate comprises, between the input thereof and the output thereof, an even number of one-stage NO-type logic gates 11 associated in series.

The PWM signal at the input indeed undergoes an elementary delay and an inversion at each passage of a one-stage NO-type logic gate 11.

The association in series of an even number of one-stage NO-type logic gates 11 subsequently makes it possible to neutralise, two-by-two, the signal inversions and to cumulate the elementary delays so as to obtain, at the output of the delay function logic gate, a delayed PWM signal having a total delay equal to the sum of the elementary delays.

The first and second delay function gates $10_{high}$ and $10_{low}$ respectively comprise the first and second numbers of different one-stage NO-type logic gates 11.

These first and second numbers depend, for example, on the maximum switching frequency aimed for, for the first and second drivers. In particular, the maximum switching frequency can be around 10 MHz.

In particular and advantageously, the first and second delay function gates $10_{high}$ and $10_{low}$ are configured to deliver respectively the first and second delayed PWM signals having a sufficient time difference between them to ensure the non-recovery, and minimum to minimise the dead times of switching and to increase the switching frequency.

This time difference corresponds to the different in the total delays obtained respectively at the output of the first and second delay function gates $10_{high}$ and $10_{low}$.

According to an advantageous possibility, the first and second pluralities of logic gates are electrically supplied by one same supply source, subsequently called main supply.

A second aspect of the invention relates to an inverter system.

According to a preferred, but non-limiting embodiment, this system can comprise, such as illustrated in FIG. 1B, an electronic circuit 1 electrically supplied by a main supply at the potentials Vdd and Vss, and controlled by a controller delivering a PWM input signal.

This inverter system preferably further comprises a power generator 100 connected to the drain of the high side transistor 14. This inverter system subsequently makes it possible to convert a high power direct current DC into a high power alternating current AC.

Advantageously, the electronic circuit 1 of the inverter system is electrically insulated from the controller and from the main supply.

A first optocoupler 2 preferably insulates the electronic circuit 1 from the controller.

A second optocoupler 2 preferably insulates the electronic circuit 1 from the main supply.

These first and second optocouplers 2, 3 preferably utilise one same insulation principle.

They can however be sized differently, for example according to the power of the electrical signals to be transmitted.

This insulation principle is as follows:

An input of such an optocoupler receiving the electrical signal is connected to a matrix of laser diodes. This laser diode matrix converts the input electrical signal into a light signal. The light signal is emitted, sent to a matrix of photovoltaic cells. Such a matrix of photovoltaic cells can be, for example, produced according to the production method disclosed in document FR 3012669 A1. This matrix of photovoltaic cells receives the light signal and converts it into an electrical signal, in order to supply the electronic circuit 1.

The first and second optocouplers 2, 3 preferably each comprise respectively, a matrix of laser diodes 20, 30 coupled with one or more facing matrices of photovoltaic cells 21, 31.

In particular, the first optocoupler 2 can be sized as follows:

Advantageously, a matrix of laser diodes 20 is connected to the controller, and rotated facing two matrices of photovoltaic cells 21. The matrix of laser diodes 20 and the matrices of photovoltaic cells 21 can be separated by a dielectric layer 200, for example, made of $SiO_2$. One of the two matrices of photovoltaic cells 21 is connected to the first driver in order to substantially deliver the PWM input signal coming from the controller.

The other matrix of photovoltaic cells 21 is connected to the second driver in order to substantially deliver the PWM input signal coming from the controller.

Each of the matrices of photovoltaic cells 21 can comprise a number of elementary cells which depend on the voltage of the PWM input signal.

For example, for elementary cells delivering around 0.3V under a light power of around 750 µW, each of the matrices of photovoltaic cells 21 can comprise 16 elementary cells so as to deliver to the total 16×0.3V=4.8V at the input of the first and second drivers.

The second optocoupler 3 can be sized as follows:

Advantageously, a matrix of laser diodes 30 is connected to the main supply, and rotated facing two matrices of photovoltaic cells 31.

The matrix of laser diodes 30 and the matrices of photovoltaic cells 31 can be separated by a dielectric layer 300, for example made of $SiO_2$.

One of the two matrices of photovoltaic cells 31 is connected to the first driver in order to deliver a first electrical supply coming from the main supply.

The other matrix of photovoltaic cells 31 is connected to the second driver in order to deliver a second electrical supply coming from the main supply.

Each of the matrices of photovoltaic cells 31 can comprise a number of elementary cells which depend on the supply voltage necessary for the first and second electrical supplies of the first and second drivers respectively.

For example, for elementary cells delivering around 0.4V under a light power of around 4 W, each of the matrices of photovoltaic cells 21 can comprise 81 elementary cells so as to deliver to the total 81×0.4V=32.4V at the input of the first and second drivers.

Such an architecture associating two matrices of photovoltaic cells 21, 31 with a matrix of laser diodes 20, 30 advantageously makes it possible to duplicate the PWM input signal and/or the main supply signal.

This architecture furthermore makes it possible to obtain an integration of the components of the optimised inverter system.

Figure 7A:
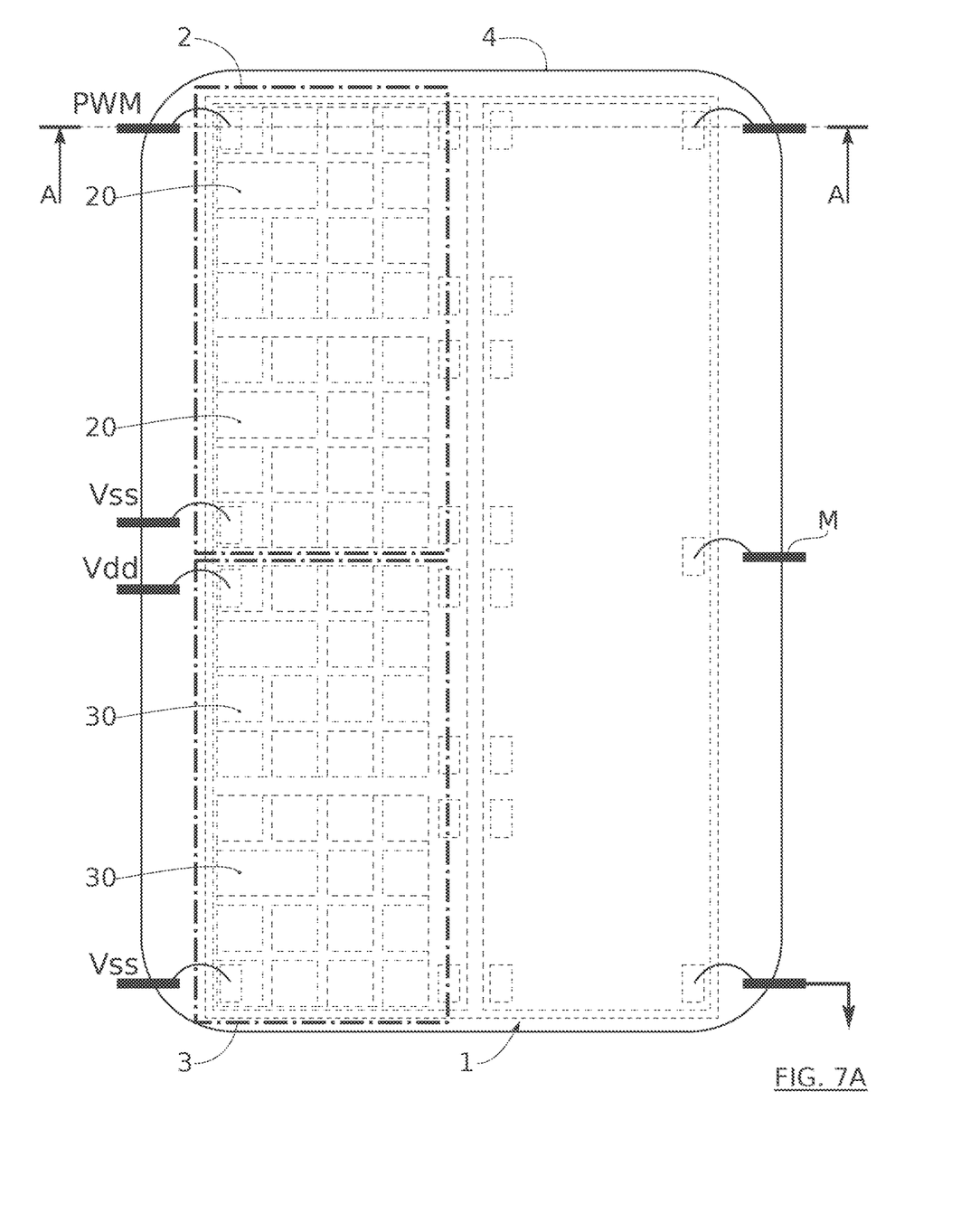
FIGS. 7A and 7B illustrate an electronic circuit, electrically insulated by an optocoupler integrated in one same casing according to an embodiment of the present invention, respectively as a top and transversal cross-sectional view along the plane A-A indicated in FIG. 7A.
Figure 7B:
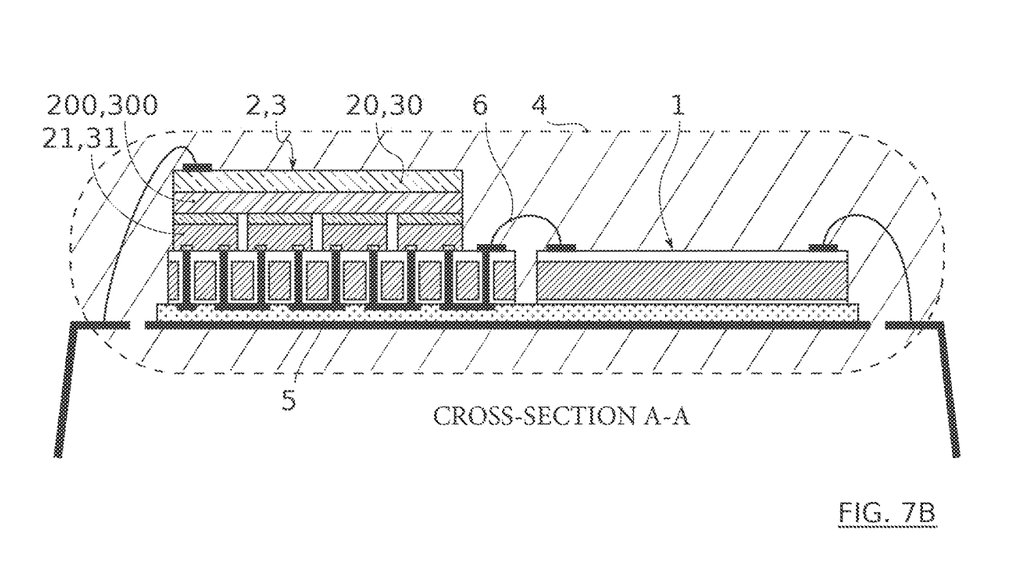
Figure 7C:
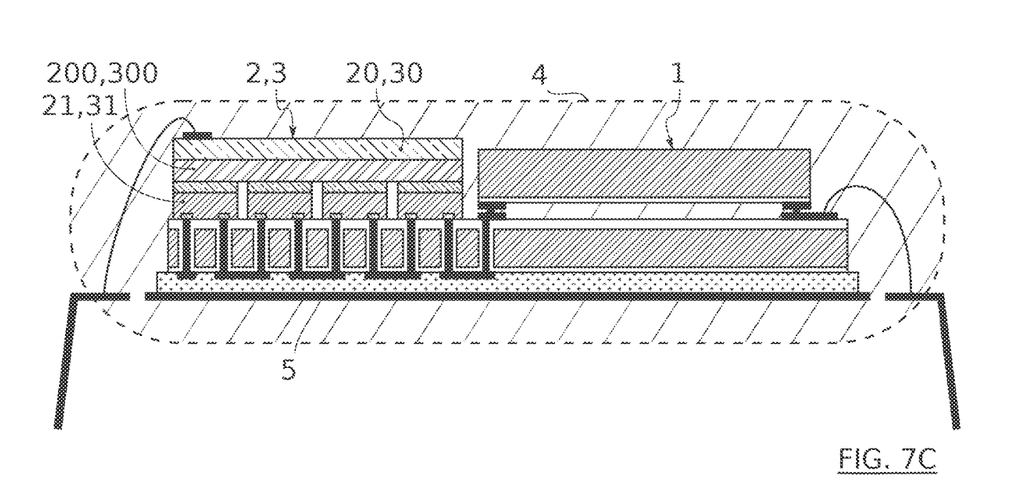
FIG. 7C illustrates, transversally cross-sectionally, an electronic circuit, electrically insulated by an optocoupler integrated in one same casing according to another embodiment of the present invention.

Such as illustrated in FIGS. 7A-7C, it is thus possible to integrate, in one same casing 4, the electronic circuit 1 and the first and second optocouplers 2, 3.

For example, the first and second optocouplers 2, 3 can be produced and/or assembled on a first chip and adhered or welded on a connection gate 5, and the electronic circuit 1 can be produced on a second chip, adhered or welded on the connection gate 5, in the proximity of the first and second optocouplers 2, 3 (FIG. 7B). Connection wires 6 can then make it possible to connect the first and second optocouplers 2, 3 to the electronic circuit 1. The casing 4 surrounding the connection gate 5, the first and second optocouplers 2, 3 and the electronic circuit 1 can be solid, of epoxy type, or with a cavity (to favour the thermal dissipation of the power converter, for example).

According to another example, the first and second optocouplers 2, 3 can be produced and/or assembled on a first chip, adhered or welded on a connection gate 5, and the electronic circuit 1 can be returned and brought back onto this first chip. The connection between the first and second optocouplers 2, 3 and the electronic circuit 1 can subsequently be achieved at the level of connection pads (FIG. 7C).

The invention is not limited to the embodiments described above and extends to all embodiments covered by the claims.

The invention claimed is:

1. An electronic circuit; comprising:
an inverter branch; and
a system configured to drive the inverter branch formed at least partially on one same semi-conductive substrate, the inverter branch comprising
a first power transistor of a high electron mobility transistor (HEMT) type connected to a floating potential and forming a high side transistor of the inverter branch, and
a second power transistor of the HEMT type connected to a ground and forming a low side transistor of the inverter branch,
the system for driving the inverter branch comprising
a first driver of the high side transistor configured to deliver a first command signal to a gate of the high side transistor from a first input signal received at an input of said first driver, and
a second driver of the low side transistor configured to deliver a second command signal to a gate of the low side transistor from a second input signal received at an input of said second driver,
wherein the first and the second input signals are synchronous and phased, and
wherein the first and the second drivers comprise respectively a first and a second plurality of logic gates configured to deliver the first and the second command signals without time overlap from the first and the second input signals.

2. The electronic according to claim 1, wherein the first and the second pluralities of logic gates only comprise resistances and gate transistors, the gate transistors being formed on the same semi-conductive substrate as the high side and the low side transistors.

3. The electronic circuit according to claim 2, wherein the gate transistors of the first and the second pluralities of logic gates are only N-type channel field effect transistors.

4. The electronic circuit according to claim 2, wherein the semi-conductive substrate, the first high side transistor and the second low side transistor, and the gate transistors of the first and the second pluralities of logic gates are GaN-based.

5. The electronic circuit according to claim 1,
wherein the first plurality of logic gates comprises:
a first delay function logic gate configured to delay the first input signal, and
a first AND-type logic gate comprising two inputs receiving respectively the first input signal and the first delayed input signal, and
wherein the second plurality of logic gates comprises:
a second delay function logic gate configured to delay the second input signal,
a NO-type logic gate configured to invert the second delayed input signal, and another NO-type logic gate configured to invert the second input signal, and
a second AND-type logic gate comprising two inputs receiving respectively the second inverted input signal and the second delayed and inverted input signal.

6. The electronic circuit according to claim 5,
wherein the NO-type logic gates are one-stage logic gates, and each comprise one single gate transistor having a gate width of between 0.5 mm and 2 mm, and
wherein the logic gates are identical to one another.

7. The electronic circuit according to claim 5, wherein the first plurality of logic gates further comprises:
a first NO-type logic gate configured to invert a signal coming from the first AND-type logic gate, and to deliver the first command signal to the gate of the first high side transistor without a fall in potential of the first command signal for a current intensity of the first command signal of between 500 mA and 5 A,
wherein the second plurality of logic gates further comprises a second NO-type logic gate configured to invert a signal coming from the second AND-type logic gate, and to deliver the second command signal to the gate of the second low side transistor without a fall in potential of the second command signal for a current intensity of the second command signal of between 500 mA and 5 A.

8. The electronic circuit according to claim 7, wherein the first and the second NO-type logic gates are called two-stage logic gates, and each comprise a first stage formed by a one-stage NO-type logic gate and a second stage connected to the first stage, the second stage comprising two gate transistors operating in phase opposition and each having a gate length of between 5 mm and 50 mm.

9. The electronic circuit according to claim 8, wherein the gate transistors of the second stage have access resistances at a level of the gates thereof greater than 1 Mega Ohm.

10. The electronic circuit according to claim 1, wherein the first and the second input signals are pulse width modulation (PWM) signals.

11. An inverter system, comprising:
an electronic circuit according to claim 1;
a first supply configured to supply the first driver;
a second supply configured to supply the second driver; and
at least one controller configured to deliver the first and the second input signals.

12. The inverter system according to claim 11, further comprising a power generator at an output of the first high side transistor, the power generator being commanded by the electronic circuit and configured to deliver an electrical signal.

13. The inverter system according to claim 12, where the semi-conductive substrate, a source of the second low side transistor, and the power generator are connected to a common ground.

14. The inverter system according to claim 11, wherein the electronic circuit is electrically insulated from the at least one controller, by at least one optocoupler comprising a matrix of laser diodes and at least one matrix of photovoltaic cells facing the matrix of laser diodes, the matrix of laser diodes being configured to receive an electrical signal coming from the at least one controller, and to generate, according to the electrical signal, a luminous flux sent to the at least one matrix of photovoltaic cells, the at least one matrix of photovoltaic cells being configured to receive the luminous flux and to deliver at least one from among the first and the second input signals.

15. The inverter system according to claim 11, wherein the electronic circuit is electrically insulated from at least one from among the first and the second supplies, by at least one optocoupler comprising a matrix of laser diodes and at least one matrix of photovoltaic cells facing the matrix of laser diodes, the matrix of laser diodes being configured to receive an electrical signal coming from at least one from among the first and the second supplies, and to generate, according to the electrical signal, a luminous flux sent to the at least one matrix of photovoltaic cells, the at least one matrix of photovoltaic cells being configured to receive the luminous flux and to deliver at least one from among the first and the second supplies.

16. The inverter system according to claim 14, wherein the electronic circuit and the at least one optocoupler are assembled in one same packaging.

17. The inverter system according to claim 12, wherein the first and the second supplies are one same main supply and the at least one controller is one single main controller.

18. The inverter system according to claim 15,
wherein the electronic circuit and the at least one optocoupler are assembled in one same packaging,
wherein the first and the second supplies are one same main supply and the at least one controller is one single main controller,
wherein the main supply is electrically insulated from the electronic circuit by a first optocoupler comprising a matrix of laser diodes connected to the main supply, a first matrix of photovoltaic cells connected to the first driver and a second matrix of photovoltaic cells connected to the second driver, the first and the second matrices of photovoltaic cells being coupled with and rotated facing the matrix of laser diodes of the first optocoupler, the first and the second matrices of photovoltaic cells being configured to supply respectively the first and the second drivers, and
wherein the main controller is electrically insulated from the electronic circuit by a second optocoupler comprising a matrix of laser diodes connected to the main controller, a first matrix of photovoltaic cells connected to the first driver and a second matrix of photovoltaic cells connected to the second driver, the first and the second matrices of photovoltaic cells being coupled with and facing the matrix of laser diodes of the second optocoupler, the first and the second matrices of photovoltaic cells being configured to deliver respectively the first and the second input signals to the first and the second drivers.

* * * * *